United States Patent [19]
Kamada et al.

[11] Patent Number: 6,165,659
[45] Date of Patent: Dec. 26, 2000

[54] METHOD OF MANUFACTURING CERAMIC ELECTRONIC PARTS

[75] Inventors: Akihiko Kamada; Isao Kato, both of Shiga-ken; Norio Sakai, Moriyama, all of Japan

[73] Assignee: Murata Manufacturing Co., Ltd., Japan

[21] Appl. No.: 09/317,140

[22] Filed: May 21, 1999

[30] Foreign Application Priority Data

Jun. 4, 1998 [JP] Japan .................................. 10-155667

[51] Int. Cl.⁷ .................................................... G03G 13/00
[52] U.S. Cl. ................................................ 430/54; 430/31
[58] Field of Search .................. 430/54, 31, 49, 430/128, 126

[56] References Cited

U.S. PATENT DOCUMENTS

| | | | |
|---|---|---|---|
| 4,897,326 | 1/1990 | Marengo | 430/31 |
| 5,266,428 | 11/1993 | Russell | 430/31 |
| 5,494,764 | 2/1996 | Hyodo | 430/31 |

*Primary Examiner*—John Goodrow
*Attorney, Agent, or Firm*—Ostrolenk, Faber, Gerb & Soffen, LLP

[57] ABSTRACT

It is an object of the present invention to provide a method of manufacturing ceramic electronic parts, with a reduced manufacturing time and a reduced manufacturing cost so as to be suitable for manufacturing many kinds or types of electronic parts but requiring only a small number of production steps. The method of producing ceramic electronic parts comprises a first process of printing an amount of electrified powder for forming a ceramic layer on a carrier member which is a film consisting of a polyethylene terephthalate (PET), so as to form a desired ceramic layer; a second process of printing an amount of electrified powder for forming internal electrodes on the ceramic layer, so as to form desired electrode patterns which will later be formed into desired internal electrodes; a third process of printing an amount of electrified powder for forming another ceramic layer on the above ceramic layer and the above electrode patterns, so as to form another desired ceramic layer.

2 Claims, 5 Drawing Sheets

METHOD OF MANUFACTURING CERAMIC ELECTRONIC PARTS

BACKGROUND OF THE INVENTION

1. Field of the Invention

The present invention relates to a method of manufacturing ceramic electronic parts, in particular to a method of manufacturing ceramic electronic parts each including ceramic layers and internal electrodes formed with the use of an electrophotography technique.

2. Description of the Related Art

Ceramic electronic parts such as a laminated capacitor, a laminated inductor, a laminated LC filter, and a multi-layered ceramic substrate, may be manufactured by laminating a plurality of green sheets, followed by sintering these laminated green sheets. In practice, each of the green sheets is formed by mixing and kneading together a ceramic powder, a binder, a plasticizer agent, and an organic solvent to obtain a paste-like material which is then formed into a plate-like piece having a predetermined thickness, followed by a drying treatment. In more detail, each green sheet has several electrode patterns formed by using a screen printing treatment so as to obtain a plurality of desired internal electrodes.

An example of a method of manufacturing the ceramic electronic parts, is a green sheet laminating method which comprises a step of forming a plurality of via holes through a plurality of ceramic green sheets, a step of printing electrode patterns on the ceramic green sheets using an electrically conductive paste as a printing material by virtue of screen printing treatment, a step of laminating together the above ceramic green sheets after having been treated in the above steps, and a step of sintering the laminated ceramic green sheets.

Figure 7:
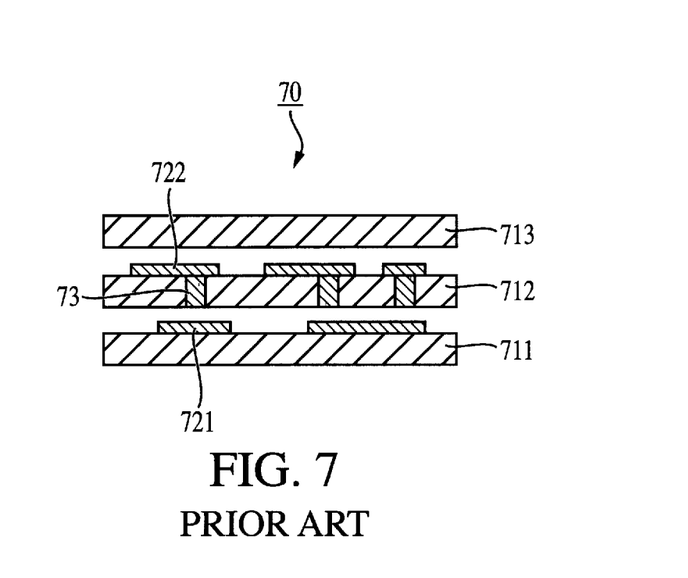
FIG. 7 is an exploded sectional view schematically indicating a multi-layered ceramic substrate made according to a prior art.

FIG. 7 is an exploded sectional view schematically indicating a multi-layered ceramic substrate produced by a green sheet laminating method which is a conventional manufacturing method according to a prior art. As shown in FIG. 7, the multi-layered ceramic substrate 70 is comprised of a plurality of ceramic green sheets 711–713. The ceramic green sheets 711 and 712 have desired internal electrodes 721, 722 formed on the inner sides thereof. Further, the ceramic green sheet 712 has a plurality of via hole electrodes 73 each formed through the ceramic green sheet. Then, the internal electrodes 721 and 722 of the ceramic green sheets 711 and 712 are mutually connected by way of via hole electrodes 73, so that they are electrically contacted with one another. In this manner, the multi-layered ceramic substrate 70 serves to form one kind of an electric circuit.

However, there are some problems associated with the above-discussed conventional method of manufacturing ceramic electronic parts. Namely, when the screen printing method is used to produce electrode patterns which will then be formed into a plurality of internal electrodes or external electrodes, it is necessary to at first prepare a special mask having a predetermined design corresponding to the electrode patterns to be formed. In particular, when manufacturing some multi-layered ceramic substrates which are likely to involve many kinds or types but are required to be produced only in a small amount, it is necessary to employ many kinds of specific masks, resulting in a problem that a relatively long time is needed to prepare these special masks, and hence causing an increase in a cost of manufacturing the multi-layered ceramic substrate.

Another problem with the above-discussed conventional method of manufacturing ceramic electronic parts is that if some internal electrodes or external electrodes are needed to be changed, it is necessary that some special masks which have already been made have to be modified in order to form desired electrode patterns for obtaining desired internal electrodes or desired external electrodes. Accordingly, the special masks for use in the above conventional method are not universal and thus they are not convenient in view of an industrial purpose.

SUMMARY OF THE INVENTION

It is an object of the present invention to provide an improved method of manufacturing ceramic electronic parts with a reduced manufacturing time and a reduced manufacturing cost, which is also suitable for manufacturing many kinds or types of electronic parts with a small production amount, thereby solving the above-discussed problems associated with the above-mentioned prior art.

According to a first aspect of the present invention, there is provided a method of manufacturing ceramic electronic parts with the use of an electrophotography technique employing an electrophotograph apparatus, said method comprising a first process including a first electrification step for electrifying a surface of a photo-sensitive body, a first exposure step for forming latent image patterns on the surface of the photo-sensitive body, a first development step for developing an electrified powder for forming a ceramic layer on to the latent image patterns formed on the surface of the photo-sensitive body, a first transfer step for transferring onto a carrier member the ceramic layer formation electrified powder developed on the latent image patterns, a first fixation step for fixing the ceramic layer formation electrified powder transferred onto the carrier member so as to form a desired ceramic layer on the carrier member; a second process including a second electrification step for electrifying a surface of the photo-sensitive body, a second exposure step for forming latent image patterns on the surface of the photo-sensitive body, a second development step for developing an electrified powder for forming electrode patterns onto the latent image patterns formed on the surface of the photo-sensitive body, a second transfer step for transferring onto the ceramic layer the electric pattern formation electrified powder developed on the latent image patterns, a second fixation step for fixing the electrode pattern formation electrified powder transferred onto the ceramic layer so as to form desired electrode patterns on the ceramic layer; a third process including a third electrification step for electrifying a surface of the photo-sensitive body, a third exposure step for forming latent image patterns on the surface of the photo-sensitive body, a third development step for developing an electrified powder for forming a ceramic layer onto the latent image patterns formed on the surface of the photo-sensitive body, a third transfer step for transferring onto the ceramic layer and the electrode patterns the ceramic layer formation electrified powder developed on the latent image patterns, a third fixation step for fixing the ceramic layer formation electrified powder transferred onto the ceramic layer and the electrode patterns so as to form another desired ceramic layer on the ceramic layer and electrode patterns. In particular, a desired laminated structure is obtained upon repeating the second process and the third process in accordance with a required number of laminated layers of the ceramic electronic parts, followed by a sintering treatment of the laminated structure.

According to a second aspect of the present invention, there is provided a method of manufacturing ceramic electronic parts with the use of an electrophotography technique employing an electrophotograph apparatus, said method comprising a first process including a first electrification step for electrifying a surface of a photo-sensitive body, a first exposure step for forming latent image patterns on the surface of the photo-sensitive body, a first development step for developing an electrified powder for forming electrode patterns on to the latent image patterns formed on the surface of the photo-sensitive body, a first transfer step for transferring onto a carrier member the electric pattern formation electrified powder developed on the latent image patterns, a first fixation step for fixing the electrode pattern formation electrified powder transferred onto the carrier member so as to form desired electrode patterns on the carrier member; a second process including a sec electrification step for electrifying a surface of the photo-sensitive body, a second exposure step for forming latent image patterns on the surface of the photo-sensitive body, a second development step for developing an electrified powder for forming a ceramic layer on to the latent image patterns formed on the surface of the photo-sensitive body, a second transfer step for transferring onto the carrier member and the electrode pattern the ceramic layer formation electrified powder developed on the latent image patterns, a second fixation step for fixing the ceramic layer formation electrified powder transferred onto the carrier member and the electrode patterns so as to form a desired ceramic layer on the carrier member and the electrode patterns; a third process including a third electrification step for electrifying a surface of the photo-sensitive body, a third exposure step for forming latent image patterns on the surface of the photo-sensitive body, a third development step for developing an electrified powder for forming a circuit pattern onto the latent image patterns formed on the surface of the photo-sensitive body, a third transfer step for transferring onto the ceramic layer the circuit pattern formation electrified powder developed on the latent image patterns, a third fixation step for fixing the circuit pattern formation electrified powder transferred onto the ceramic layer so as to form desired circuit patterns on the ceramic layer. In particular, a desired laminated structure is obtained upon repeating the second process and the third process in accordance with a required number of laminated layers of the ceramic electronic parts, followed by a sintering treatment of the laminated structure.

With the use of the methods of the present invention for manufacturing ceramic electronic parts, since all the ceramic layers and all the electrode patterns forming the ceramic electronic parts may be formed by virtue of electrophotography treatment, it is allowed to dispense with various specific masks which were needed in the above prior art for forming some internal electrodes and some external electrodes.

BRIEF DESCRIPTION OF THE DRAWINGS

FIG. 1 is an explanatory view schematically indicating a method of manufacturing ceramic electronic parts, according to a first preferred embodiment of the present invention, in which FIGS. 1A–1E are used to indicate a first process, FIGS. 1F–1J are used to indicate a second process, and FIGS. 1K–1O are used to indicate a third process;

FIG. 3 is an explanatory view schematically indicating a method of manufacturing ceramic electronic parts, according to a second preferred embodiment of the present invention, in which FIGS. 3A–3E are used to indicate a first process, FIGS. 3F–3J are used to indicate a second process, and FIGS. 3K–3O are used to indicate a third process;

DESCRIPTION OF THE PREFERRED EMBODIMENTS

Several preferred embodiments of the present invention will be described in detail in the following with reference to the accompanying drawings.

Figure 1A:
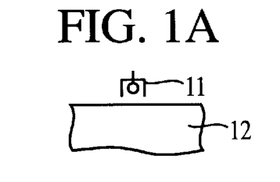
Figure 1B:
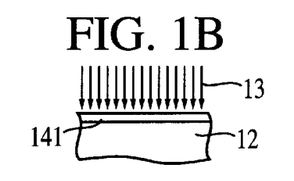
Figure 1C:
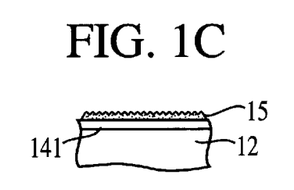
Figure 1D:
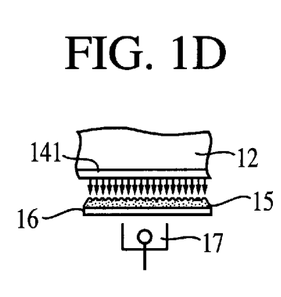
Figure 1E:
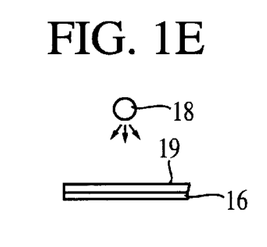
Figure 1F:
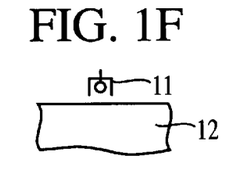
Figure 1G:
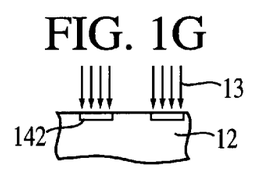
Figure 1H:
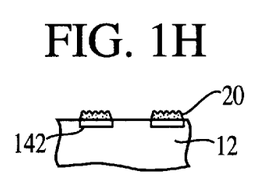
Figure 1I:
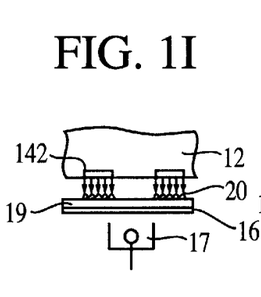
Figure 1J:
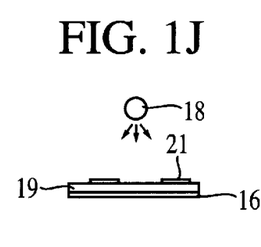
Figure 1K:
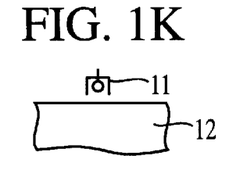
Figure 1L:
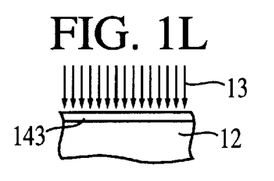
Figure 1M:
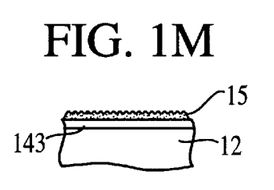
Figure 1N:
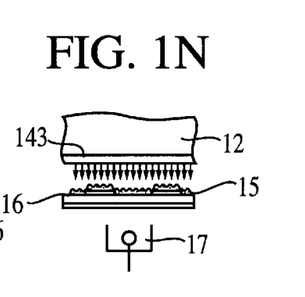
Figure 1O:
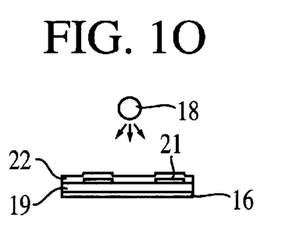

FIGS. 1A to 1O is an explanatory view schematically indicating a method of manufacturing ceramic electronic parts, constituted according to a first preferred embodiment of the present invention. Referring to FIGS. 1A to 1O, this method of producing ceramic electronic parts comprises a first process of printing an amount of electrified powder for forming a ceramic layer on a carrier member which is a film consisting of a polyethylene terephthalate (hereinafter referred to as PET), so as to form a desired ceramic layer; a second process of printing an amount of electrified powder for forming electrode patterns on the ceramic layer, so as to form the desired electrode patterns; a third process of printing an amount of electrified powder for forming another ceramic layer on the above ceramic layer and the above electrode patterns, so as to form the another desired ceramic layer.

Here, the first process includes a first electrification step (shown in FIG. 1A), a first exposure step (shown in FIG. 1B), a first development step (shown in FIG. 1c), a first transfer step (shown in FIG. 1D), and a first fixation step (shown in FIG. 1E). The second process includes a second electrification step (shown in FIG. 1F), a second exposure step (shown in FIG. 1G), a second development step (shown in FIG. 1H), a second transfer step (shown in FIG. 1I), and a second fixation step (shown in FIG. 1J). The third process includes a third electrification step (shown in FIG. 1K), a third exposure step (shown in FIG. 1L), a third development step (shown in FIG. 1M), a third transfer step (shown in FIG. 1N), and a third fixation step (shown in FIG. 1O).

At first, as shown in FIG. 1A, in the first electrification step, a corona electrifier 11 is employed to cause a photo-sensitive body 12 to be electrified to bear negative electric charges. Then, as shown in FIG. 1B, in the first exposure step, a surface of the photo-sensitive body 12 is irradiated by a laser beam 13, so as to form on said surface a latent image pattern 141 from which electric charges have already vanished.

Subsequently, as shown in FIG. 1C, in the first development step, an amount of negatively electrified powder 15 for forming a ceramic layer is caused to adhere to the latent image pattern 141 on the surface of the photo-sensitive body 12, by virtue of a electrostatic force. After that, as shown in FIG. 1D, in the first transfer step, a transfer means 17 located on the back side of a carrier member 16 is used to produce positive electric charges (having an inverse polarity that is just opposite to that of the negatively electrified powder 15 for forming a ceramic layer) on to the carrier member 16, thereby transferring the electrified powder 15 developed on the latent image pattern 141 onto the carrier member 16.

Subsequently, as shown in FIG. 1E, in the first fixation step, a flash lamp 18 is employed to produce a light to perform a predetermined irradiation, so as to fix the electrified powder 15 transferred onto the carrier member 16, thereby forming a ceramic layer 19 on the carrier member 16.

Further, as shown in FIG. 1F, in the second electrification step, a corona electrifier 11 is employed to cause the photo-sensitive body 12 to be electrified to bear negative electric charges. Then, as shown in FIG. 1G, in the second exposure step, a surface of the photo-sensitive body 12 is irradiated by a laser beam 13, so as to form on said surface a latent image pattern 142 from which electric charges have already vanished.

Subsequently, as shown in FIG. 1H, in the second development step, an amount of negatively electrified powder 20 for forming some electrode patterns is caused to adhere to the latent image pattern 142 on the surface of the photo-sensitive body 12, by virtue of a electrostatic force. After that, as shown in FIG. 1I, in the second transfer step, a transfer means 17 located on the back side of a carrier member 16 is used to produce positive electric charges (having an inverse polarity that is just opposite to that of negatively electrified powder 20 for forming the above electrode patterns) on to the carrier member 16, thereby transferring the electrified powder 20 developed on the latent image pattern 142 onto the ceramic layer 19.

Subsequently, as shown in FIG. 1J, in the second fixation step, a flash lamp 18 is employed to produce a light to perform a predetermined irradiation, so as to fix the electrified powder 20 transferred onto the ceramic layer 19, thereby forming the electrode patterns 21 on the ceramic layer 19.

Further, as shown in FIG. 1K, in the third electrification step, a corona electrifier 11 is employed to cause a photo-sensitive body 12 to be electrified to bear negative electric charges. Then, as shown in FIG. 1L, in the third exposure step, a surface of the photo-sensitive body 12 is irradiated by a laser beam 13, so as too form on said surface a latent image pattern 143 from which electric charges have already vanished.

Subsequently, as shown in FIG. 1M, in the third development step, an amount of negatively electrified powder 15 for forming a ceramic layer is caused to adhere to the latent image pattern 143 on the surface of the photo-sensitive body 12, by virtue of an electrostatic force. After that, as shown in FIG. 1N, in the third transfer step, a transfer means 17 located on the back side of a carrier member 16 is used to produce positive electric charges (having an inverse polarity that is just opposite to that of the negatively electrified powder 15 for forming a ceramic layer) onto the carrier member 16, thereby transferring the electrified powder 15 developed on the latent image pattern 143 onto the ceramic layer 19 and the electrode patterns 21.

Subsequently, as shown in FIG. 1O, in the third fixation step, the flash lamp 18 is employed to produce a Light to perform a predetermined irradiation, so as to fix the electrified powder 15 transferred onto the ceramic layer 19 and the electrode patterns 21, thereby forming another ceramic layer 22 on the ceramic layer 19 and the electrode patterns 21.

Afterwards, although not shown in the drawings, the above second process (shown in FIGS. 1F–1J) and the above third process (shown in FIGS. 1K–1O) may be repeated corresponding to a required number of laminated layers of a ceramic substrate, so as to form a desired laminated structure. Finally, the formed laminated structure is separated from the carrier member 16, followed by a sinterring treatment of said laminated structure.

In this way, the desired ceramic electronic parts can be produced through the above processes.

Figure 2:
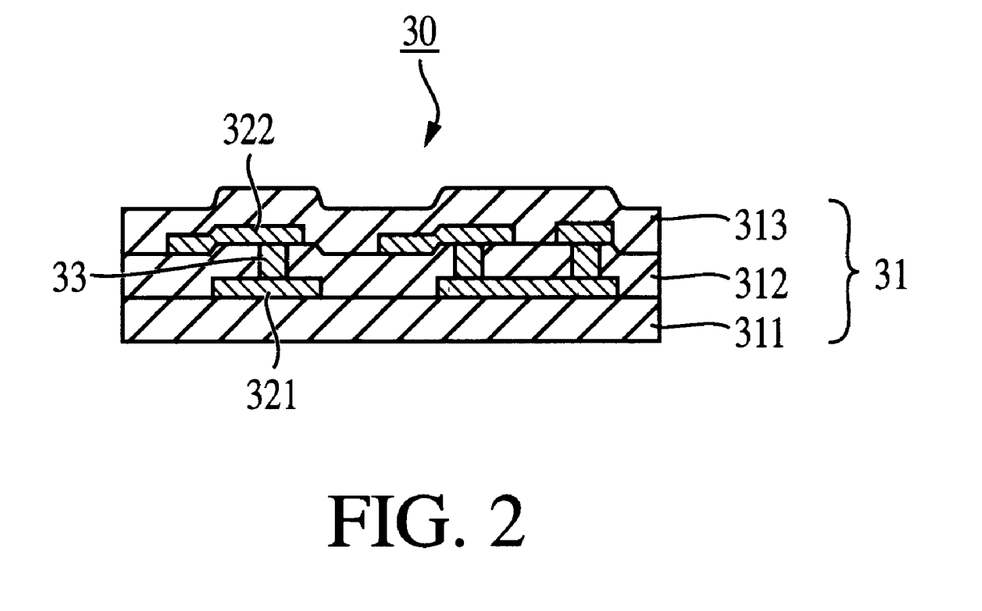
FIG. 2 is a sectional view schematically indicating a multi-layered ceramic substrate made by using the method shown in FIG. 1 for manufacturing ceramic electronic parts.

FIG. 2 is a cross sectional view schematically indicating a multi-layered ceramic substrate obtained by using the method (shown in FIG. 1) of manufacturing ceramic electronic parts. As shown in FIG. 2, the multi-layered ceramic substrate 30 serving as one of the ceramic electronic parts, has a first through a third ceramic layers 311–313, internal electrodes 321 and 322 formed on the first and the second ceramic layers 311 and 312.

Namely, the multi-layered ceramic substrate shown in FIG. 2 may be obtained by repeating twice the second and the third processes of the manufacturing method shown in FIG. 1 to produce a laminated body 31, then followed by a sinterring treatment of said laminated body 30, thereby forming the desired multi-layered ceramic substrate 30 which can be used as an electronic circuit.

At this moment, the internal electrodes 321 and 322 on the ceramic layers 311 and 312 are mutually connected by means of the via hole electrodes 33, thus rendering them to be electrically conductive to each other.

FIG. 3 is an explanatory view schematically indicating a method of manufacturing ceramic electronic parts, constituted according to a second preferred embodiment of the present invention. Referring to FIG. 3, this method of producing ceramic electronic parts comprises a first process of printing an amount of electrified powder for forming some electrode patterns on a carrier member which is a film consisting of a polyethylene terephthalate (hereinafter referred to as PET), so as to form some desired electrode patterns; a second process of printing an amount of electrified powder for forming a ceramic layer on the carrier member and the electrode patterns, so as to form a desired ceramic layer; a third process of printing an amount of electrified powder for forming other electrode patterns on the above ceramic layer, so as to form said other electrode patterns.

Figure 3A:
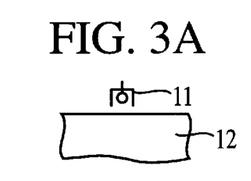
Figure 3B:
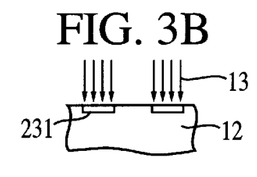
Figure 3C:
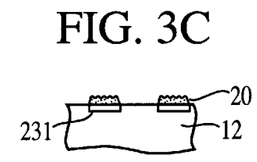
Figure 3D:
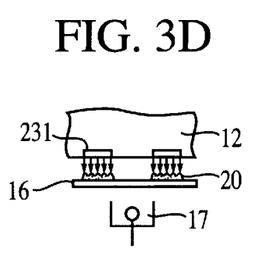
Figure 3E:
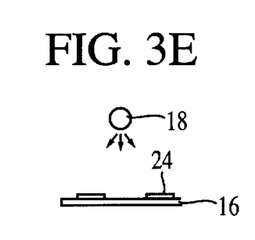

Here, the first process includes a first electrification step (shown in FIG. 3A), a first exposure step (shown in FIG. 3B), a first development step (shown in FIG. 3C), a first transfer step (shown in FIG. 3D), and a first fixation step (shown in FIG. 3E). The second process includes a second electrification step (shown in FIG. 3F), a second exposure step (shown in FIG. 3G), a second development step (shown in FIG. 3H), a second transfer step (shown in FIG. 3I), and a second fixation step (shown in FIG. 3J). The third process includes a third electrification step (shown in FIG. 3K), a third exposure step (shown in FIG. 3L), a third development step (shown in FIG. 3M), a third transfer step (shown in FIG. 3N), and a third fixation step (shown in FIG. 3O).

At first, as shown in FIG. 3A, in the first electrification step, a corona electrifier 11 is employed to cause a photo-sensitive body 12 to be electrified to bear negative electric charges. Then, as shown in FIG. 3B, in the first exposure step, a surface of a photo-sensitive body 12 is irradiated by a laser beam 13, so as to form on said surface a latent image pattern 231 from which electric charges have already vanished.

Subsequently, as shown in FIG. 3C, in the first development step, an amount of negatively electrified powder 20 for forming some electrode pattern is caused to adhere to the latent image pattern 231 on the surface of the photo-sensitive body 12, by virtue of a electrostatic force. After that, as shown in FIG. 3D, in the first transfer step, a transfer means 17 located on the back side of a carrier member 16 is used to produce positive electric charges (having an inverse polarity that is just opposite to that of the negatively electrified powder 20 for forming some electrode patterns) onto the carrier member 16, thereby transferring the electrified powder 20 developed on the latent image pattern 231 onto the carrier member 16.

Subsequently, as shown in FIG. 3E, in the first fixation step, a flash lamp 18 is employed to produce a light to perform a predetermined irradiation, so as to fix the electrified powder 20 transferred onto the carrier member 16, thereby forming the desired electrode patterns 24 on the carrier member 16.

Figure 3F:
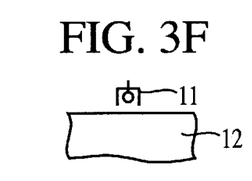
Figure 3G:
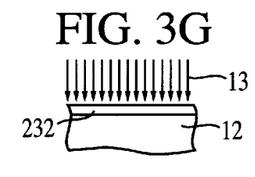

Further, as shown in FIG. 3F, in the second electrification step, a corona electrifier 11 is employed to cause a photo-sensitive body 12 to be electrified to bear negative electric charges. Then, as shown in FIG. 3G, in the second exposure step, a surface of the photo-sensitive body 12 is irradiated by a laser beam 13, so as to form on said surface a latent image pattern 232 from which electric charges have already vanished.

Figure 3H:
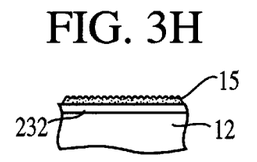
Figure 3I:
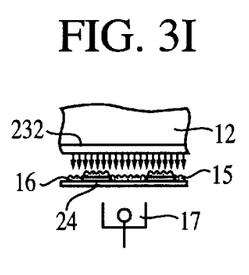

Subsequently, as shown in FIG. 3H, in the second development step, an amount of negatively electrified powder 15 for forming a ceramic layer is caused to adhere to the latent image pattern 232 on the surface of the photo-sensitive body 12, by virtue of a electrostatic force. After that, as shown in FIG. 3I, in the second transfer step, a transfer means 17 located on the back side of a carrier member 16 is used to produce positive electric charges (having an inverse polarity that is just opposite to that of negatively electrified powder 15 for forming a ceramic layer) onto the carrier member 16, thereby transferring the electrified powder 15 developed on the latent image pattern 232 onto the carrier member 16 and the electrode patterns 24.

Figure 3J:
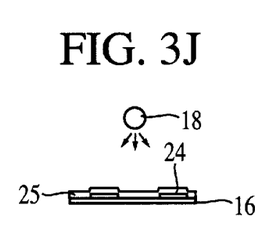

Subsequently, as shown in FIG. 3J, in the second fixation step, a flash lamp 18 is employed to produce a light to perform a predetermined irradiation, so as to fix the electrified powder 15 transferred onto the carrier member 16 and electrode patterns 24, thereby forming a desired ceramic layer 25 on the carrier member 16 and the electrode patterns 24.

Figure 3K:
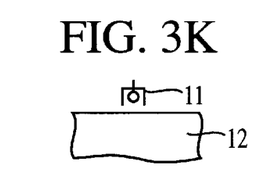
Figure 3L:
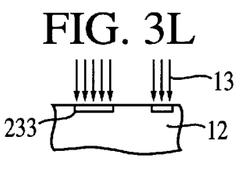

Further, as shown in FIG. 3K, in the third electrification step, a corona electrifier 11 is employed to cause a photo-sensitive body 12 to be electrified to bear negative electric charges. Then, as shown in FIG. 3L, in the third exposure step, a surface of the photo-sensitive body 12 is irradiated by a laser beam 13, so as to form on said surface a latent image pattern 233 from which electric charges have already vanished.

Figure 3M:
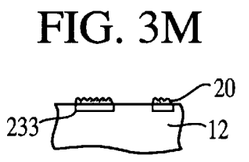
Figure 3N:
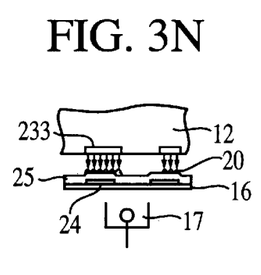

Subsequently, as shown in FIG. 3M, in the third development step, an amount of negatively electrified powder 20 for forming some electrode patterns is caused to adhere to the latent image pattern 233 on the surface of the photo-sensitive body 12, by virtue of an electrostatic force. After that, as shown in FIG. 3N, in the third transfer step, a transfer means 17 located on the back side of a carrier member 16 is used to produce positive electric charges (having an inverse polarity that is just opposite to that of the negatively electrified powder 20 for forming some electrode patterns) onto the carrier member 16, thereby transferring the electrified powder 20 developed on the latent image pattern 233 on to the ceramic layer 25.

Figure 3O:
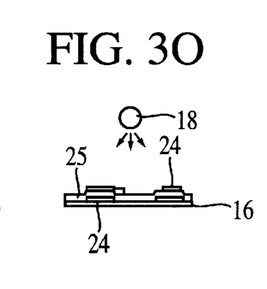

Subsequently, as shown in FIG. 3O, in the third fixation step, a flash lamp 18 is employed to produce a light to perform a predetermined irradiation, so as to fix the electrified powder 20 transferred onto the ceramic layer 25, thereby forming the electrode patterns 24 onto the ceramic layer 25.

Afterwards, although not shown in the drawings, the above second process (shown in FIGS. 3F–3J) and the above third process (shown in FIGS. 3K–3O) may be repeated corresponding to a required number of laminated layers of a ceramic electronic element, so as to form a desired laminated structure. Finally, the formed laminated structure is treated in a sinterring treatment, thereby obtaining a desired product.

In this way, the desired ceramic electronic parts of this kind can be produced through the above processes.

Figure 4:
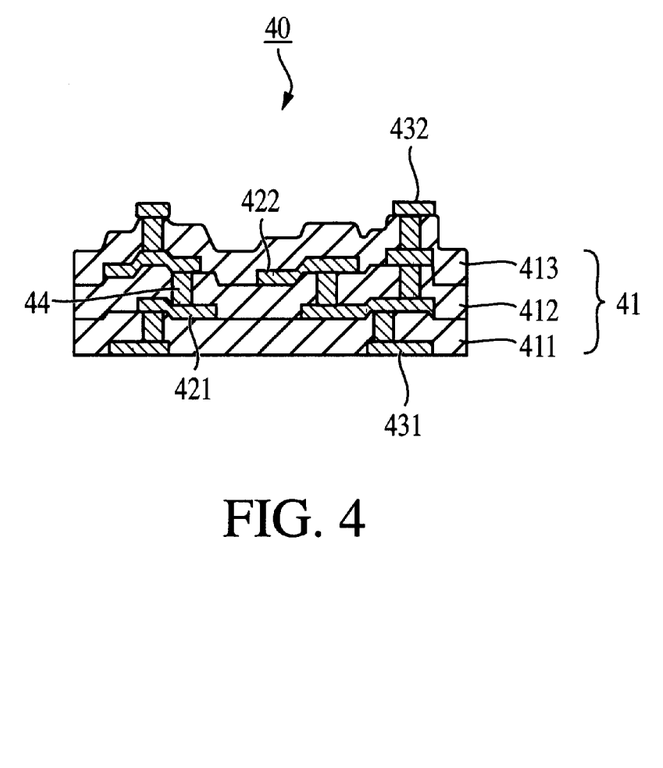
FIG. 4 is a sectional view schematically indicating a multi-layered ceramic substrate made by using the method shown in FIG. 3 for manufacturing ceramic electronic parts.

FIG. 4 is a cross sectional view schematically indicating a multi-layered ceramic substrate obtained by using the method shown in FIG. 3 for manufacturing ceramic electronic parts. As shown in FIG. 4, the multi-layered ceramic substrate 40 serving as one of the ceramic electronic parts, has a first through a third ceramic layers 411–413, internal electrodes 421 and 422 formed on the first and the second ceramic layers 411 and 412, external electrodes 431 and 432 formed on the outer surface of the first ceramic layer 411 and the outer surface of the third ceramic layer 413.

Namely, the multi-layered ceramic substrate shown in FIG. 4 may be obtained by repeating twice the second and the third processes of the manufacturing method shown in FIG. 3, so as to produce a laminated structure 41, then followed by a sinterring treatment of said laminated structure 41, thereby forming a desired multi-layered ceramic substrate 40 which can be used as an electronic circuit.

At this moment, the internal electrodes 421 and 422 formed on the ceramic layers 411 and 412, similarly, the external electrodes 431 and 432 formed on the outer surface of the first ceramic layer 411 and the outer surface of the third ceramic layer 413, are mutually connected by means of the via hole electrodes 44, thus rendering them to be electrically conductive to one another.

In this way, with the use of the method of manufacturing ceramic electronic parts, according to the above first and the second embodiments of the present invention, since all the ceramic layers and all the internal electrodes forming the ceramic electronic parts are formed by virtue of an electro-photography technique, it is not necessary to prepare a lot of specific masks for forming electrode patterns which will then be formed into the internal electrodes, nor is it needed to perform mask changing operation during an entire process of manufacturing the desired ceramic electronic parts. As a result, it is allowed to reduce a time and a cost for the manufacturing of the ceramic electronic parts, so that the method of the present invention is particularly suitable for manufacturing electronic parts involving many kinds or types but requiring only a small production amount.

Figure 5A:
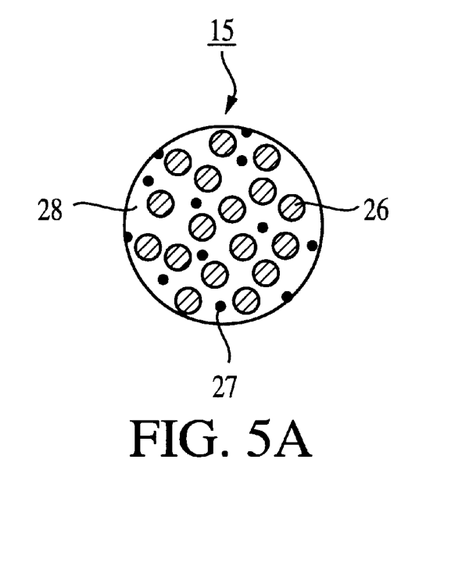
FIGS. 5A and 5B are cross sectional views schematically indicating the internal structure of the particles of an electrified powder for forming ceramic layers and the internal structure of the particles of electrified powder for forming electrode patterns, all of which may be used in the methods of the present invention for manufacturing ceramic electronic parts, shown in FIG. 1 and FIG. 3.
Figure 5B:
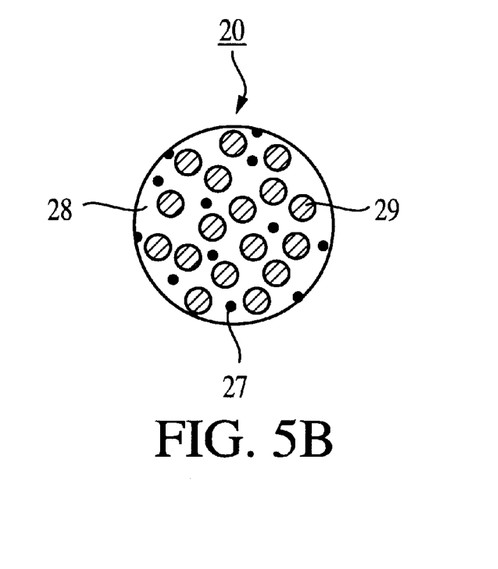

FIGS. 5A and 5B are cross sectional views schematically indicating the internal structure of the particles of an electrified powder for forming the above ceramic layers and the internal structure of the particles of an electrified powder for forming the above electrode patterns, all of which have been used in the first and second embodiments of the method of the present invention, shown in FIG. 1 and FIG. 3.

As shown in FIG. 5A, each particle of the electrified powder 15 for forming a ceramic layer is comprised of a) a ceramic powder 26 containing as its main components a barium oxide, an aluminum oxide and a silica, b) a electric charge controlling agent 27 consisting of an azoic metallic dyestuff, c) a thermoplastic resin 28 consisting of a styrene acyl copolymer, with the mixing ratio being 90:1:9=a): b): c). In more detail, each particle of the powder for forming a ceramic layer may be seen as presenting a structure formed by uniformly dispersing the ceramic powder 26 and the electric charge controlling agent 27 throughout the thermoplastic resin 28.

As shown in FIG. 5B, each particle of the electrified powder 20 for forming the internal electrodes is comprised of e) an electrically conductive metallic powder 29 consisting of a copper powder, f) an electric charge controlling agent 27 consisting of an azoic metallic dyestuff, 9) a thermoplastic resin 28 consisting of a styrene acyl copolymer, with the mixing ratio being 90:1:9=e): f): g). In more detail, each particle of the powder for forming the internal electrodes may be seen as presenting a structure formed by uniformly dispersing the electrically conductive metallic powder 29 and the electric charge controlling agent 27 throughout the thermoplastic resin 28.

Figure 6:
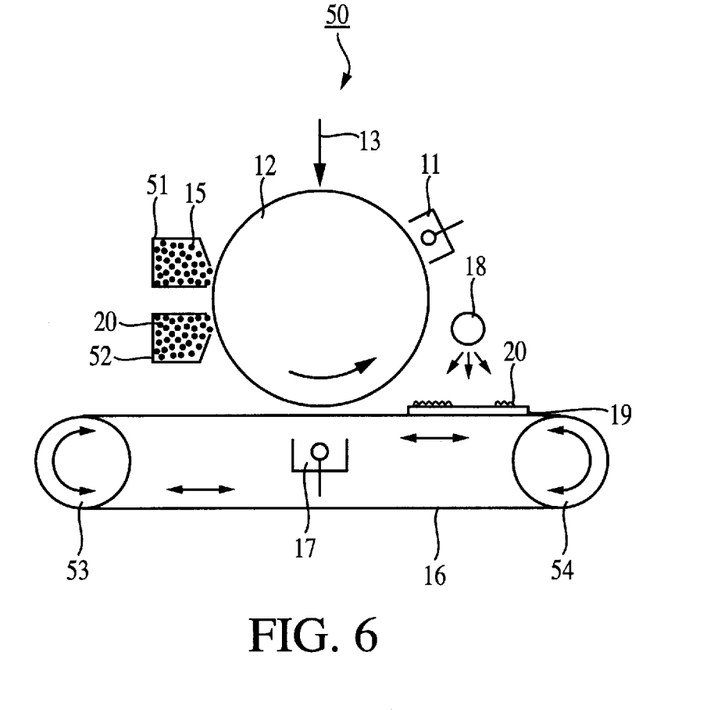
FIG. 6 is an explanatory view schematically indicating an electrophotography apparatus for use in the methods of FIG. 1 and FIG. 3 for manufacturing ceramic electronic parts.

FIG. 6 is an explanatory view schematically indicating an electrophotography apparatus 50 for use in the method of the present invention, shown in FIG. 1 and FIG. 3 for manufacturing the ceramic electronic parts. As shown in FIG. 6, the electrophotography apparatus 50 comprises a photo-sensitive body 12, a corona electrifier 11 which is used to electrify the surface of the photo-sensitive body 12, a laser beam 13 for forming latent image patterns (not shown) on the surface of the photo-sensitive body 12, an electrified powder supplying apparatus 51 which is used to supply an electrified powder 15 for forming aceramic layer onto the latent image patterns formed on the surface of the photo-sensitive body 12, an electrified powder supplying apparatus 52 which is used to supply an electrified powder 20 for forming internal electrodes onto the latent image patterns formed on the surface of the photo-sensitive body 12, a transfer means 17 which is used to transfer the electrified powder 15 (for forming a ceramic layer) or the electrified powder 20 (for forming the electrode patterns) attached to the latent image patterns formed on the surface of the photo-sensitive body 12, a flash lamp 18 which is used to fix the transferred electrified powder 15 (for forming a ceramic layer) or the electrified powder 20 (for forming the electrode patterns) so as to form a desired ceramic layer (not shown) and the desired electrode patterns (now shown), a pair of rollers 53 and 54 both of which are surrounded by a carrier member 16 so as to be engaged by said carrier member 16, in a manner such that the carrier member 16 is allowed to move horizontally to form a desired ceramic layer and desired electrode patterns in the predetermined positions.

Although the above description of the method for manufacturing ceramic electronic parts (according to the first and second embodiments of the present invention) has indicated that the via hole electrodes may be formed at the same time when forming the electrode patterns (which will then be formed into internal electrodes or external electrodes), it is also possible that a process for forming the via hole electrodes solely may be conducted independently from the process for forming the above electrode patterns, by virtue of a similar process including an electrification step, an exposure step, a development step, a transfer step, and a fixation step.

Further, although it has been described in the above disclosure that the electrophotography apparatus (for use in the present method of manufacturing ceramic electronic parts) has one photo-sensitive body, it is also possible that the above first through fourth processes may employ a plurality of such photo-sensitive bodies.

Moreover, although it has been described in the above disclosure that the ceramic substrate has a three-layer structure, it is also possible that the number of the layers forming the ceramic substrate may be changed by repeating the above second and third processes, if necessary.

In addition, although it has been described in the above disclosure that the method of the present invention is suitable for use in manufacturing the ceramic electronic parts which are multi-layered ceramic substrates, the method of the present invention may also be used to manufacture some other electronic parts such as a laminated condenser, a laminated inductor, and a laminated LC filter.

Further, although it has been described in the above disclosure that the carrier member is a PET film, it is also possible that such a carrier member may be a glass epoxy substrate having a shape like a substrate plate.

Moreover, although it has been described in the above disclosure that the method for manufacturing ceramic electronic parts (according to the first embodiment of the present invention) may be used to manufacture a multi-layered ceramic substrate containing only internal electrodes, it is also possible that the method of the first embodiment of the present invention may be used to print some external electrodes in position by virtue of screen printing method, with such printing treatment being carried out after the formation of a laminated structure.

As may be understood from the above description, with the use of the method of the present invention for manufacturing ceramic electronic parts, since all the ceramic layers and all the internal electrodes forming the ceramic electronic parts are formed by virtue of electrophotography technique, it is not necessary to prepare a lot of specific masks for forming electrode patterns (which will then be formed into internal electrodes), nor is it needed to perform a mask changing operation during an entire process of manufacturing the ceramic electronic parts. As a result, it is allowed to reduce a time and a cost for manufacturing ceramic electronic parts, so that the method of the present invention is particularly suitable for manufacturing electronic parts involving many kinds or types but requiring only a small production amount.

While the invention has been particularly shown and described with reference to preferred embodiments thereof, it will be understood by those skilled in the art that the foregoing and other changes in form and details may be made therein without departing from the spirit of the invention.

What is claimed is:

1. A method of manufacturing ceramic electronic parts with the use of an electrophotography technique employing an electrophotograph apparatus, said method comprising:

a first process including a first electrification step of electrifying a surface of a photo-sensitive body, a first exposure step of forming latent image patterns on the surface of the photo-sensitive body, a first development step of developing an electrified powder for forming a ceramic layer on the latent image patterns formed on the surface of the photo-sensitive body, a first transfer step of transferring onto a carrier member the ceramic layer developed on the latent image patterns, and a first fixation step of fixing the ceramic layer transferred onto the carrier member so as to form a desired ceramic layer on the carrier member;

a second process including a second electrification step of electrifying a surface of the photo-sensitive body, a second exposure step of forming latent image patterns on the surface of the photo-sensitive body, a second development step of developing an electrified powder for forming electrode patterns on the latent image patterns formed on the surface of the photo-sensitive body, a second transfer step of transferring onto the ceramic layer the electrode patterns developed on the latent image patterns, a second fixation step of fixing the electrode patterns transferred onto the ceramic layer so as to form desired electrode patterns on the ceramic layer;

a third process including a third electrification step of electrifying a surface of the photo-sensitive body, a third exposure step of forming latent image patterns on the surface of the photo-sensitive body, a third development step of developing an electrified powder for forming a ceramic layer on the latent image patterns formed on the surface of the photo-sensitive body, a third transfer step of transferring onto the ceramic layer and the electrode patterns the ceramic layer developed on the latent image patterns, and a third fixation step of fixing the ceramic layer transferred onto the ceramic layer and the electrode patterns so as to form another desired ceramic layer on the ceramic layer and electrode patterns;

wherein a desired laminated structure is obtained upon repeating the second process and the third process in accordance with a required number of laminated layers of the ceramic electronic parts, followed by a sintering treatment of the laminated structure.

2. A method of manufacturing ceramic electronic parts with the use of an electrophotography technique employing an electrophotograph apparatus, said method comprising:

a first process including a first electrification step of electrifying a surface of a photo-sensitive body, a first exposure step of forming latent image patterns on the surface of the photo-sensitive body, a first development step of developing an electrified powder for forming electrode patterns on the latent image patterns formed on the surface of the photo-sensitive body, a first transfer step of transferring onto a carrier member the electrode patterns developed on the latent image patterns, and a first fixation step of fixing the electrode patterns transferred onto the carrier member so as to form desired electrode patterns on the carrier member;

a second process including a second electrification step of electrifying a surface of the photo-sensitive body, a second exposure step of forming latent image patterns on the surface of the photo-sensitive body, a second development step of developing an electrified powder for forming a ceramic layer on the latent image patterns formed on the surface of the photo-sensitive body, a second transfer step of transferring onto the carrier member and the electrode pattern the ceramic layer developed on the latent image patterns, and a second fixation step for fixing the ceramic layer transferred onto the carrier member and the electrode patterns so as to form a desired ceramic layer on the carrier member and the electrode patterns;

a third process including a third electrification step of electrifying a surface of the photo-sensitive body, a third exposure step of forming latent image patterns on the surface of the photo-sensitive body, a third development step of developing an electrified powder for forming a circuit pattern on the latent image patterns formed on the surface of the photo-sensitive body, a third transfer step of transferring onto the ceramic layer the circuit pattern developed on the latent image patterns, and a third fixation step of fixing the circuit pattern transferred onto the ceramic layer so as to form desired circuit patterns on the ceramic layer;

wherein a desired laminated structure is obtained upon repeating the second process and the third process in accordance with a required number of laminated layers of the ceramic electronic parts, followed by a sintering treatment of the laminated structure.

* * * * *